United States Patent
Wall et al.

(10) Patent No.: US 10,186,476 B2
(45) Date of Patent: Jan. 22, 2019

(54) SEMICONDUCTOR PACKAGE WITH GROUNDED FENCE TO INHIBIT DENDRITES OF DIE-ATTACH MATERIALS

(71) Applicant: Qorvo US, Inc., Greensboro, NC (US)

(72) Inventors: Larry Wall, Allen, TX (US); Christopher Sanabria, Richardson, TX (US)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 15/605,587

(22) Filed: May 25, 2017

(65) Prior Publication Data

US 2018/0130722 A1 May 10, 2018

Related U.S. Application Data

(60) Provisional application No. 62/418,358, filed on Nov. 7, 2016.

(51) Int. Cl.
*H01L 29/15* (2006.01)
*H01L 23/495* (2006.01)
(Continued)

(52) U.S. Cl.
CPC ...... *H01L 23/49513* (2013.01); *H01L 23/043* (2013.01); *H01L 23/315* (2013.01);
(Continued)

(58) Field of Classification Search
CPC ....... H01L 2224/73265; H01L 2924/00; H01L 2224/32225; H01L 2224/48227;
(Continued)

(56) References Cited

U.S. PATENT DOCUMENTS 6,278,613 B1 * 8/2001 Fernandez ............. B23K 31/02
257/707
8,829,918 B2 * 9/2014 Sylvester ............. G01R 31/048
324/538

(Continued)

OTHER PUBLICATIONS

Lu, Guo-Quan et al., "Migration of Sintered Nanosilver on Alumina and Aluminum Nitride Substrates at High Temperatures in Dry Air for Electronic Packaging," IEEE Transactions on Device and Materials Reliability, vol. 14, Issue 2, Jun. 2014, IEEE, pp. 600-606.

(Continued)

*Primary Examiner* — Mohammed Shamsuzzaman
(74) *Attorney, Agent, or Firm* — Withrow & Terranova, P.L.L.C.

(57) ABSTRACT

The present disclosure relates to a semiconductor package with at least one grounded fence to inhibit dendrites of die-attach materials. The semiconductor package includes a carrier, a die-attach material, and a wire-bonded die. The carrier includes a die pad and a negative carrier contact. The wire-bonded die includes a die body, a negative die contact, a grounded fence, and a bonding wire. A bottom surface of the die body is coupled to the die pad by the die-attach material. The negative die contact and the grounded fence reside over a top surface of the die body. The grounded fence, which has a same DC potential as the die pad, extends between the negative die contact and a periphery of the top surface of the die body. The bonding wire extends from the negative die contact to the negative carrier contact.

25 Claims, 12 Drawing Sheets

Figure 1A:
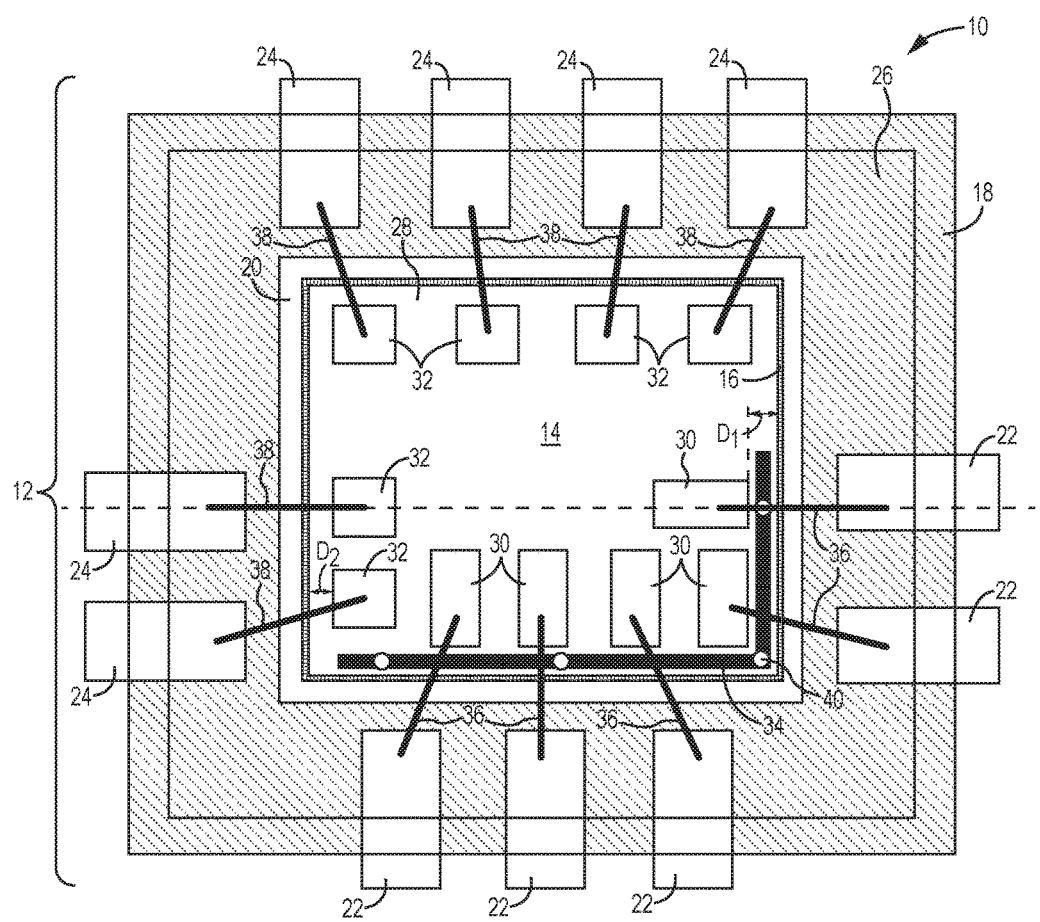

(51) Int. Cl.
  *H01L 29/20* (2006.01)
  *H01L 29/16* (2006.01)
  *H01L 23/31* (2006.01)
  *H01L 23/498* (2006.01)
  *H01L 23/58* (2006.01)
  *H01L 23/00* (2006.01)
  *H01L 23/043* (2006.01)

(52) U.S. Cl.
  CPC .... *H01L 23/4952* (2013.01); *H01L 23/49562* (2013.01); *H01L 23/49861* (2013.01); *H01L 23/58* (2013.01); *H01L 24/00* (2013.01); *H01L 29/16* (2013.01); *H01L 29/1602* (2013.01); *H01L 29/1608* (2013.01); *H01L 29/20* (2013.01); *H01L 29/2003* (2013.01); *H01L 23/3107* (2013.01)

(58) Field of Classification Search
  CPC . H01L 2924/00012; H01L 2224/32245; H01L 2224/48247; H01L 2224/92247; H01L 2924/00014; H01L 2224/48091; H01L 2924/15311; H01L 2224/05599; H01L 2224/45099; H01L 21/56; H01L 2224/05571; H01L 2224/05573; H01L 2224/1134; H01L 2224/13144; H01L 2224/48235; H01L 2224/48464; H01L 2224/73207; H01L 2224/92; H01L 23/3128; H01L 24/48; H01L 24/73; H01L 24/91; H01L 2924/01013; H01L 2924/01029; H01L 2924/01033; H01L 2924/01078; H01L 2924/01079; H01L 2924/01082; H01L 2924/014; H01L 2924/14; H01L 2924/15331; H01L 2924/16152; H01L 2924/3025; H01L 29/16; H01L 29/1602; H01L 29/1608; H01L 29/20; H01L 29/003; H01L 23/49513; H01L 23/315; H01L 23/4952; H01L 23/49562

USPC ...... 257/77, 659, 88, 706; 324/538; 361/719
  See application file for complete search history.

(56) References Cited

U.S. PATENT DOCUMENTS

| | | | |
|---|---|---|---|
| 2009/0212401 A1* | 8/2009 | Do | H01L 21/56 257/659 |
| 2013/0214298 A1* | 8/2013 | Lin | H01L 33/60 257/88 |
| 2013/0299960 A1* | 11/2013 | Chan | H01L 33/642 257/706 |
| 2017/0221843 A1* | 8/2017 | Chang | H01L 25/50 |

OTHER PUBLICATIONS

Li, Yi et al., "Silver migration control in Electrically Conductive Adhesives," Conference on High Density Microsystem Design and Packaging and Component Failure Analysis (HDP'06), Jun. 27-28, 2006, Shanghai, China, IEEE, 7 pages.

Zhan, Sheng et al., "Dendritic Growth on the Die under Hermetic High Temperature Operation," Prognostics and Health Management Conference (PHM '10), Jan. 12-14, 2010, Macao, China, IEEE, 6 pages.

* cited by examiner

SEMICONDUCTOR PACKAGE WITH GROUNDED FENCE TO INHIBIT DENDRITES OF DIE-ATTACH MATERIALS

RELATED APPLICATIONS

This application claims the benefit of provisional patent application Ser. No. 62/418,358, filed Nov. 7, 2016, the disclosure of which is hereby incorporated herein by reference in its entirety.

FIELD OF THE DISCLOSURE

The present disclosure relates to a semiconductor package, and more particularly to a semiconductor package with at least one grounded fence to inhibit dendrites of die-attach materials.

BACKGROUND

In semiconductor packaging, mold compounds are widely used to encapsulate flip-chip dies and wire-bonded dies to protect the dies against damage from the outside environment. However, direct contact of the mold compounds and active die surfaces may adversely impact the electrical performance of the dies, especially for dies that support high frequency applications. Accordingly, it is desirable to package the dies in an air cavity configuration.

However, die-attach materials used to attach the dies to a carrier may form dendrites in air cavity packages. For instance, the die-attach materials for the dies, which are formed by Gallium nitride (GaN) technology and include GaN field-effect transistors (FETs), have high potential to form dendrites. It is because the GaN FETs require significant negative gate biases, such that there is an electric field formed between the negative-biased gates as cathodes and the die-attach materials (typically coupled to the ground) as anodes. In addition, because the die-attach materials are not sealed off in the air cavity packages, the dendrites of the die-attach materials may grow along side walls of the dies from the anodes towards the cathodes, and eventually cause an electrical short.

Accordingly, there remains a need for improved package designs to inhibit dendrites of die-attach materials without degrading the electronic performance of the dies. Further, there is also a need to keep the final product size effective and cost effective.

SUMMARY

The present disclosure relates to a semiconductor package with at least one grounded fence to inhibit dendrites of die-attach materials. The semiconductor package includes a carrier, a die-attach material, and a wire-bonded die. The carrier includes a die pad and a first negative carrier contact. The wire-bonded die includes a die body that has a top surface and a bottom surface opposite the top surface of the die body, a first negative die contact, a first grounded fence, and a first bonding wire. Herein, the bottom surface of the die body is coupled with a top surface of the die pad by the die-attach material. The first negative die contact and the first grounded fence reside over the top surface of the die body. The first grounded fence, which has a same DC potential as the die pad, extends between the first negative die contact and a periphery of the top surface of the die body. In addition, the first bonding wire extends from the first negative die contact to the first negative carrier contact.

In one embodiment of the semiconductor package, the die-attach material is a dendrite forming metal.

In one embodiment of the semiconductor package, the die-attach material is formed of sintered silver or tin.

In one embodiment of the semiconductor package, the carrier further comprises a non-negative carrier contact, and the wire-bonded die further comprises a non-negative die contact and a second bonding wire. Herein, the die pad is surrounded by the first negative carrier contact and the non-negative carrier contact. The non-negative die contact resides over the top surface of the die body and the second bonding wire extends from the non-negative die contact to the non-negative carrier contact.

In one embodiment of the semiconductor package, the first grounded fence does not extend between the non-negative die contact and the periphery of the top surface of the die body. Herein, a first distance between the first negative die contact and the periphery of the top surface of the die body is longer than a second distance between the non-negative die contact and the periphery of the top surface of the die body.

In one embodiment of the semiconductor package, the first grounded fence further extends between the first negative die contact and the non-negative die contact, such that the first negative die contact is at least partially encompassed by the first grounded fence.

In one embodiment of the semiconductor package, the first grounded fence is a closed-loop and fully encompasses the first negative die contact.

In one embodiment of the semiconductor package, the first grounded fence extends between the non-negative die contact and the periphery of the top surface of the die body.

In one embodiment of the semiconductor package, the first grounded fence is a closed-loop and encompasses the first negative die contact and the non-negative die contact.

In one embodiment of the semiconductor package, the first grounded fence is electronically coupled to the die pad by a via structure through the die body and the die-attach material.

In one embodiment of the semiconductor package, the wire-bonded die is formed by one of a group consisting of Gallium nitride (GaN) technology, Gallium arsenide (GaAs) technology, Indium phosphide (InP) technology, Silicon (Si) technology, Silicon carbide (SiC) technology, and diamond technology.

In one embodiment of the semiconductor package, the first grounded fence is formed from metal strips.

In one embodiment of the semiconductor package, the wire-bonded die further includes a second negative die contact that resides over the top surface of the die body and is adjacent to the first negative die contact. Herein, the first grounded fence is continuous and extends between the second negative die contact and the periphery of the top surface of the die body.

In one embodiment of the semiconductor package, the wire-bonded die further includes a second negative die contact and a second grounded fence. Herein, the second negative die contact resides over the top surface of the die body and is not adjacent to the first negative die contact. The second grounded fence, which has a same DC potential as the die pad, resides over the top surface of the die body and between the second negative die contact and the periphery of the top surface of the die body. The second grounded fence is separate from the first grounded fence.

In one embodiment of the semiconductor package, the first grounded fence does not extend between the non-negative die contact and the periphery of the top surface of the die body, and the second grounded fence does not extend between the non-negative die contact and the periphery of the top surface of the die body.

In one embodiment of the semiconductor package, the carrier is a lead frame such that the first negative carrier contact is a metal lead and the die pad is a metal pad. Herein, the semiconductor package further includes an enclosure, which is coupled to the first negative carrier contact and forming a cavity over the carrier. The wire-bonded die is disposed within the cavity. The first bonding wire is exposed to a gaseous environment within the cavity.

In one embodiment of the semiconductor package, the carrier is a laminate substrate and further comprises a carrier body. The die pad is embedded in the carrier body and extends from a top surface of the carrier body to a bottom surface of the carrier body. The first negative carrier contact resides over the top surface of the carrier body. Herein, the semiconductor package further includes an enclosure coupled to the carrier body to form a cavity over the carrier. The wire-bonded die is disposed within the cavity. The first negative carrier contact and the first bonding wire are exposed to a gaseous environment within the cavity.

According to another embodiment, the semiconductor package further includes a mold compound residing over the carrier to encapsulate the wire-bonded die.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

Figure 1B:
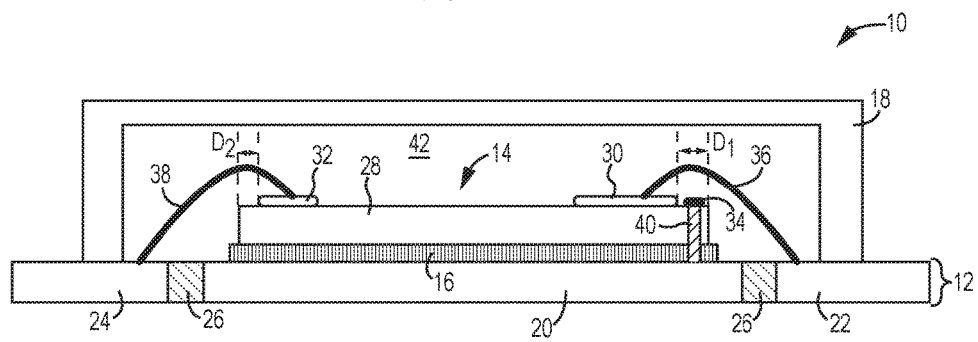

FIGS. 1A-1B provide an exemplary semiconductor package with a grounded fence according to one embodiment of the present disclosure.

Figure 2:
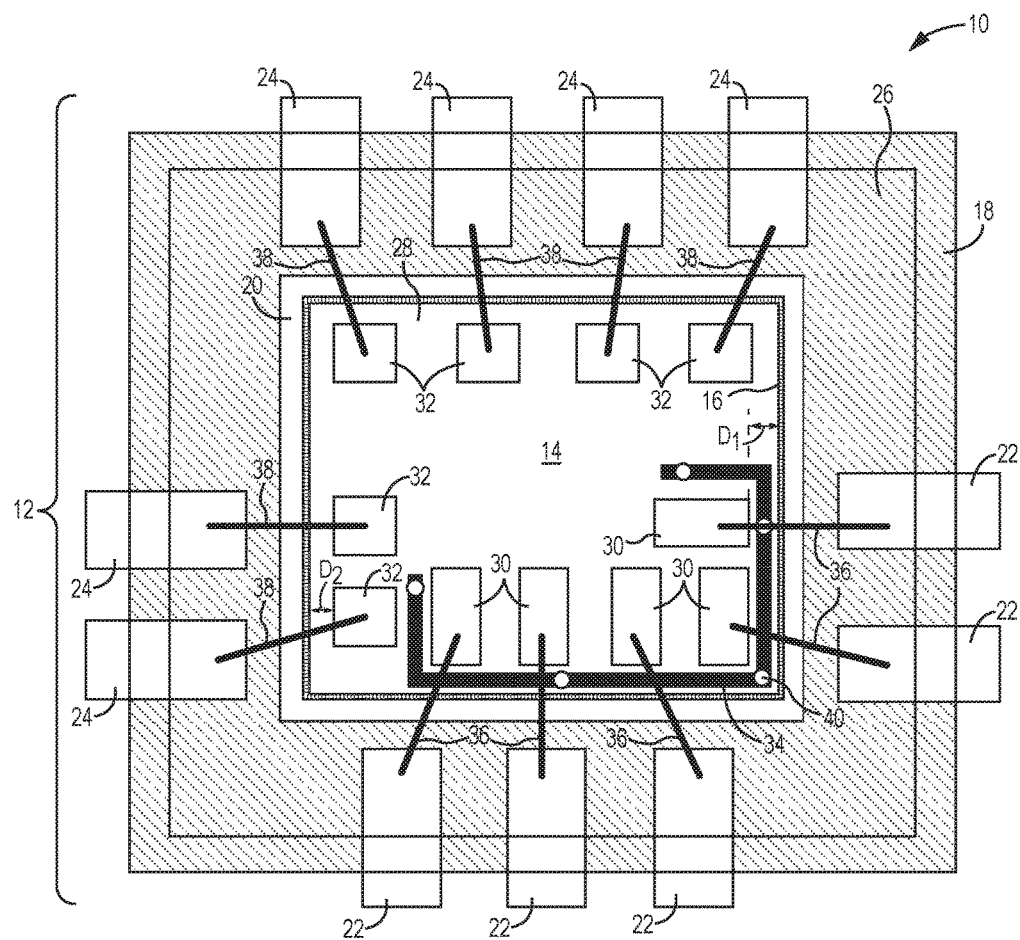

FIG. 2 provides an exemplary semiconductor package with an alternative grounded fence according to one embodiment of the present disclosure.

Figure 3:
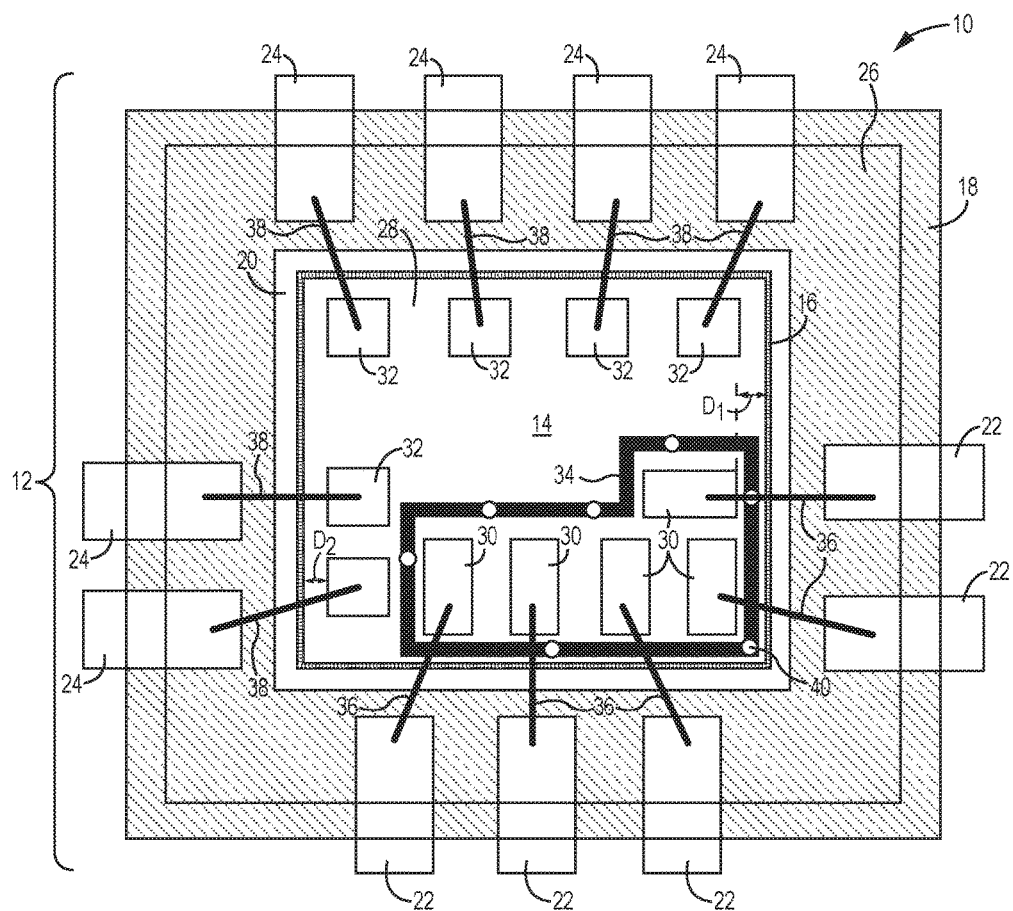

FIG. 3 provides an exemplary semiconductor package with an alternative grounded fence according to one embodiment of the present disclosure.

Figure 4:
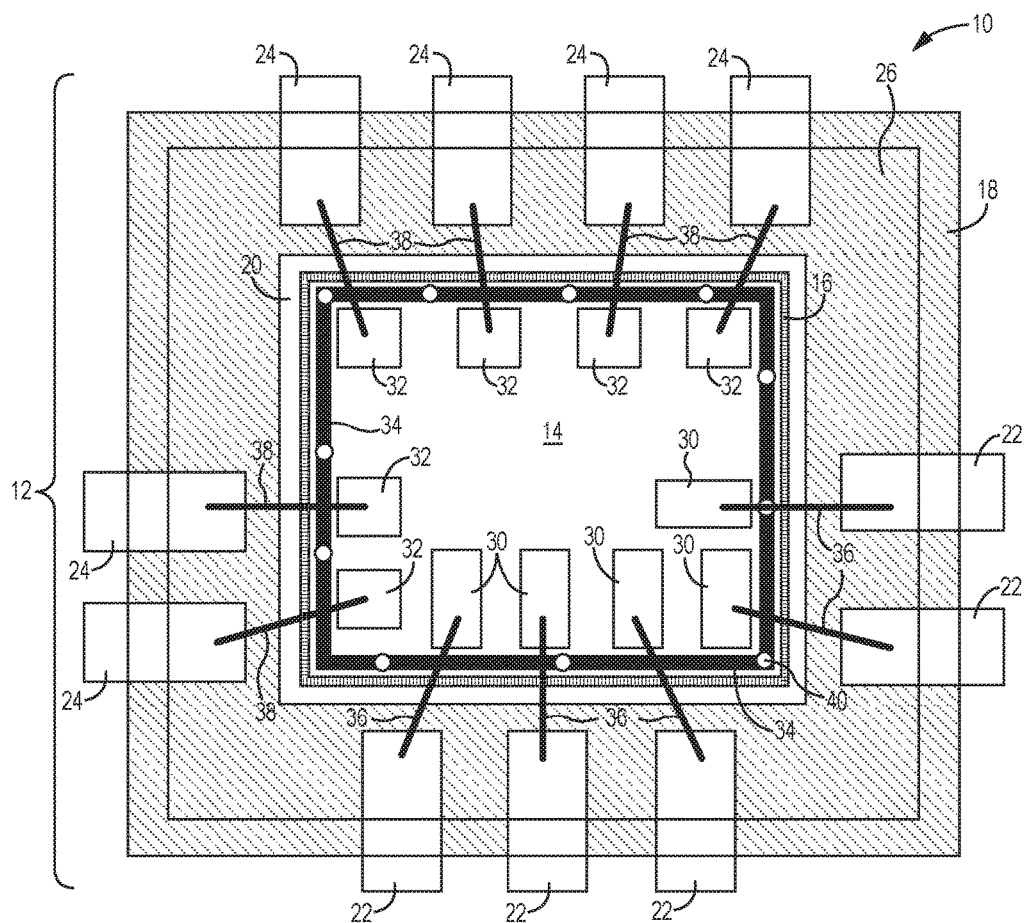

FIG. 4 provides an exemplary semiconductor package with an alternative grounded fence according to one embodiment of the present disclosure.

Figure 5:
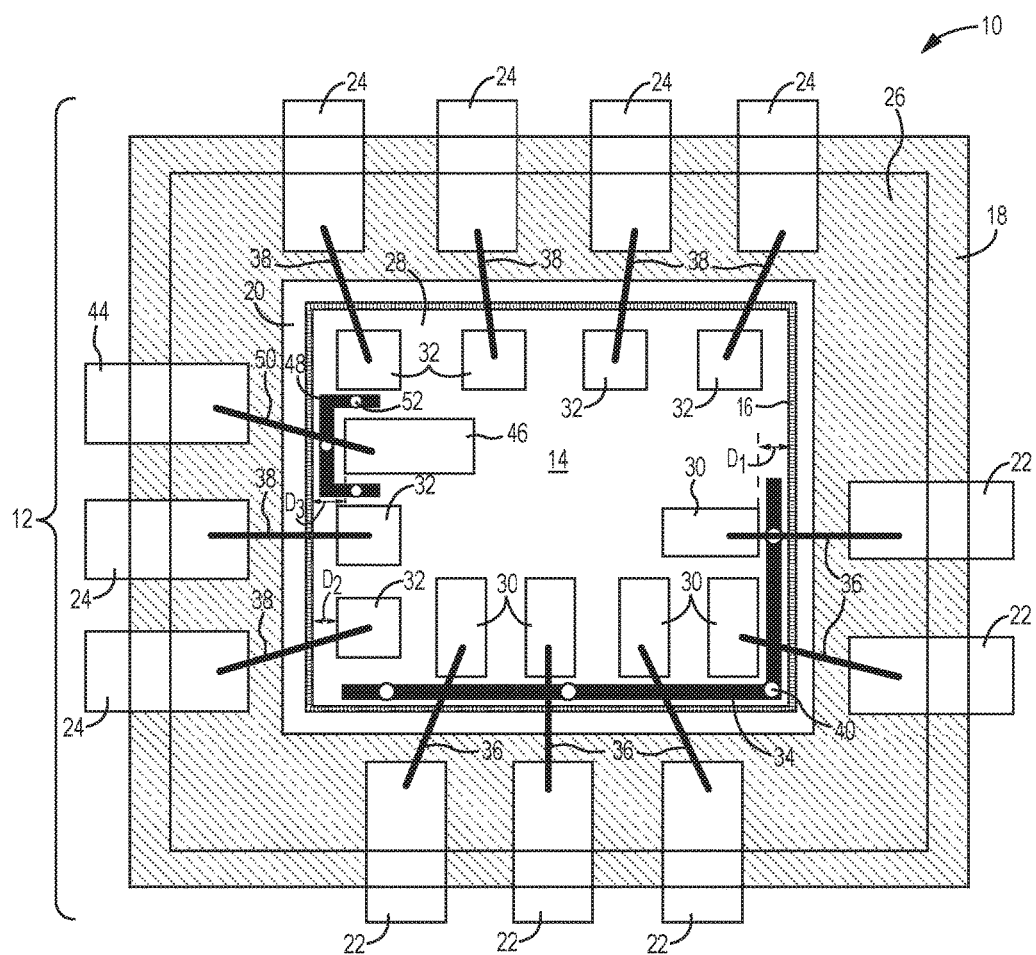

FIG. 5 provides an exemplary semiconductor package with multiple grounded fences according to one embodiment of the present disclosure.

Figure 6:
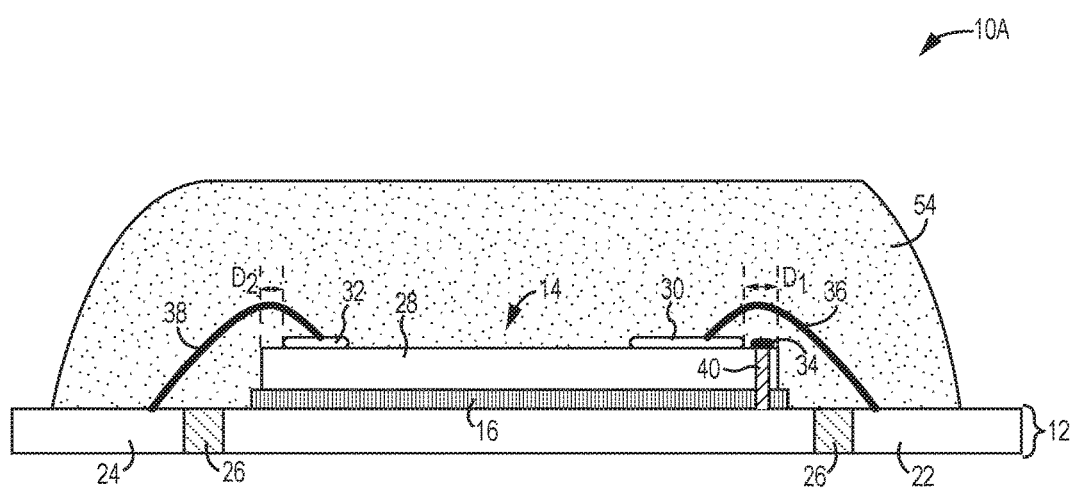

FIG. 6 provides an alternative semiconductor package with a grounded fence according to one embodiment of the present disclosure.

Figure 7A:
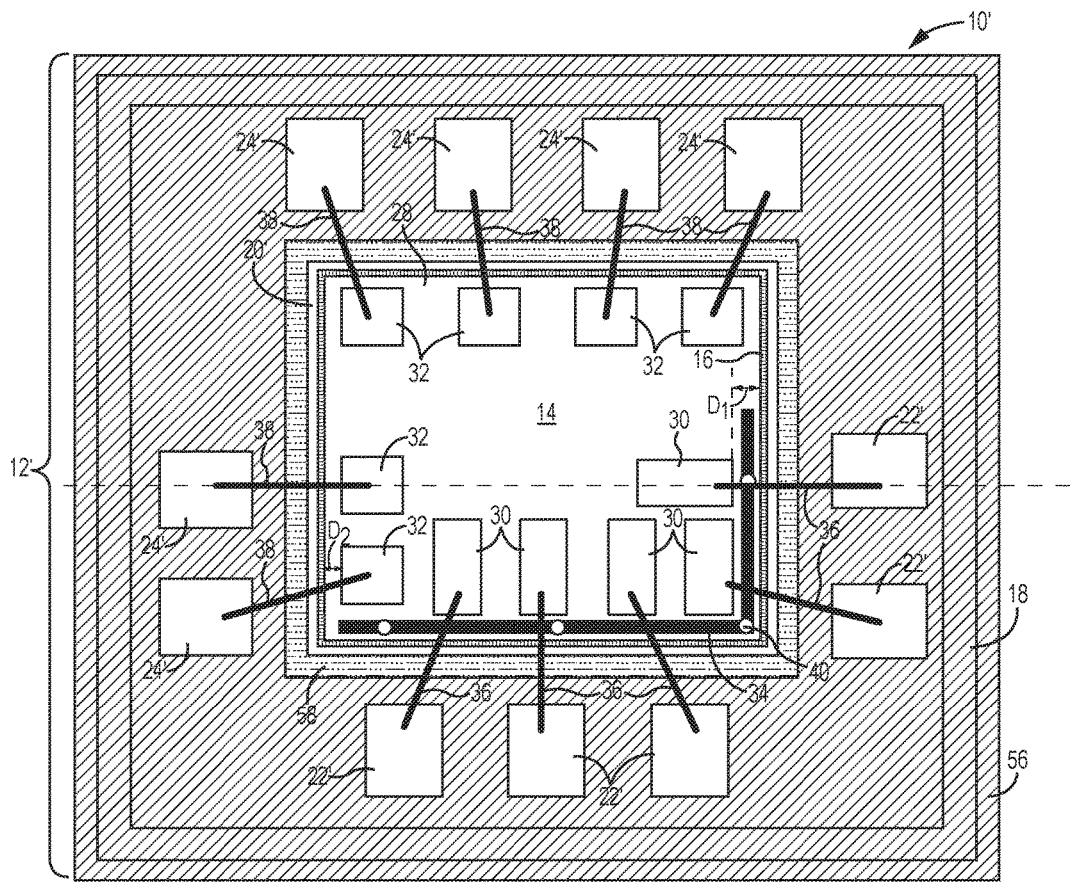
Figure 7B:
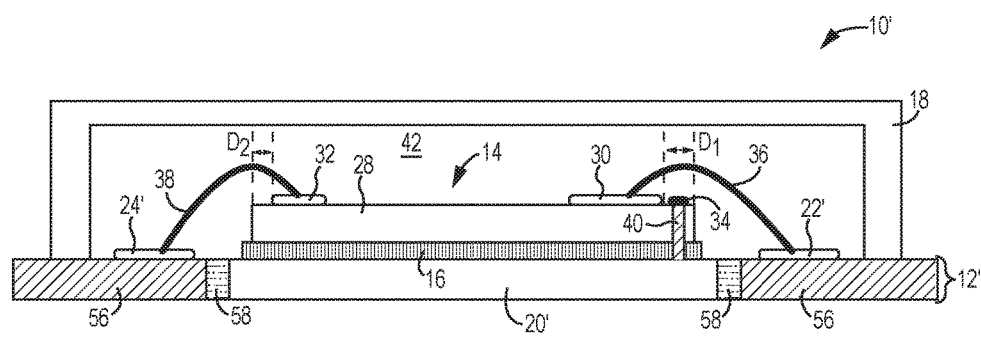

FIGS. 7A-7B provide an exemplary semiconductor package with a grounded fence according to one embodiment of the present disclosure.

Figure 8:
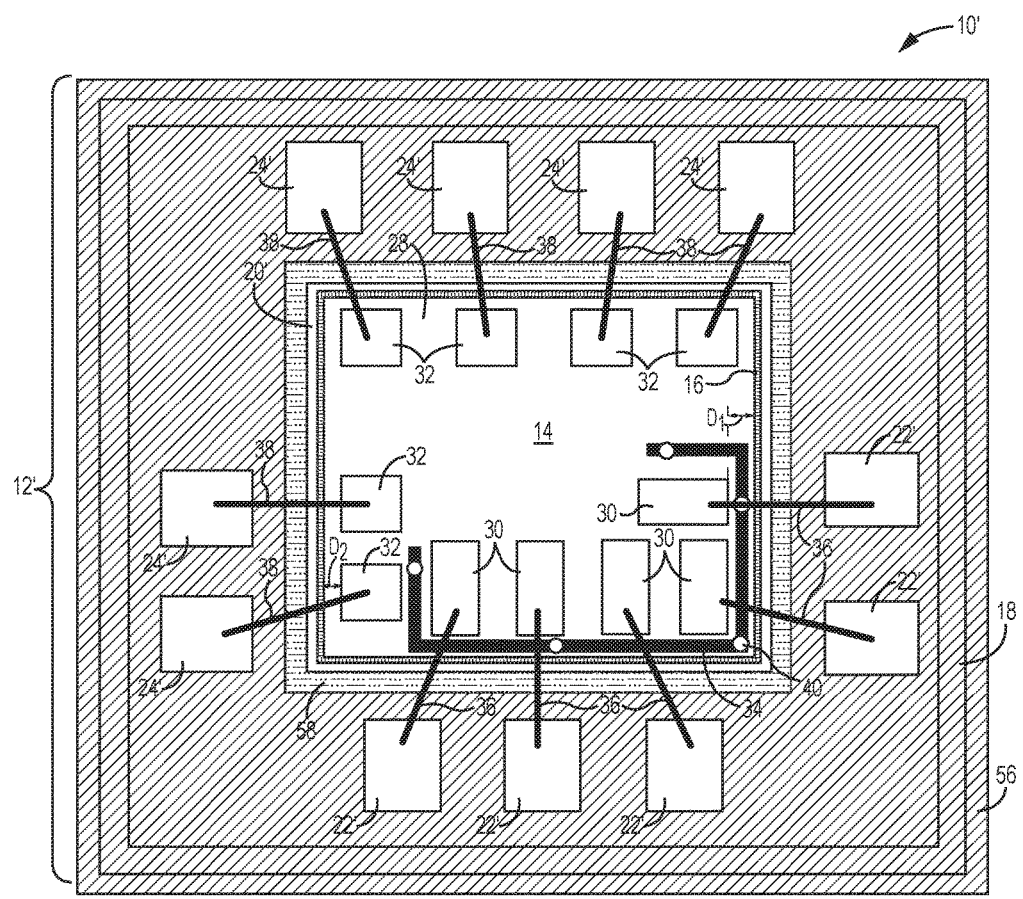

FIG. 8 provides an alternative semiconductor package with a grounded fence according to one embodiment of the present disclosure.

Figure 9:
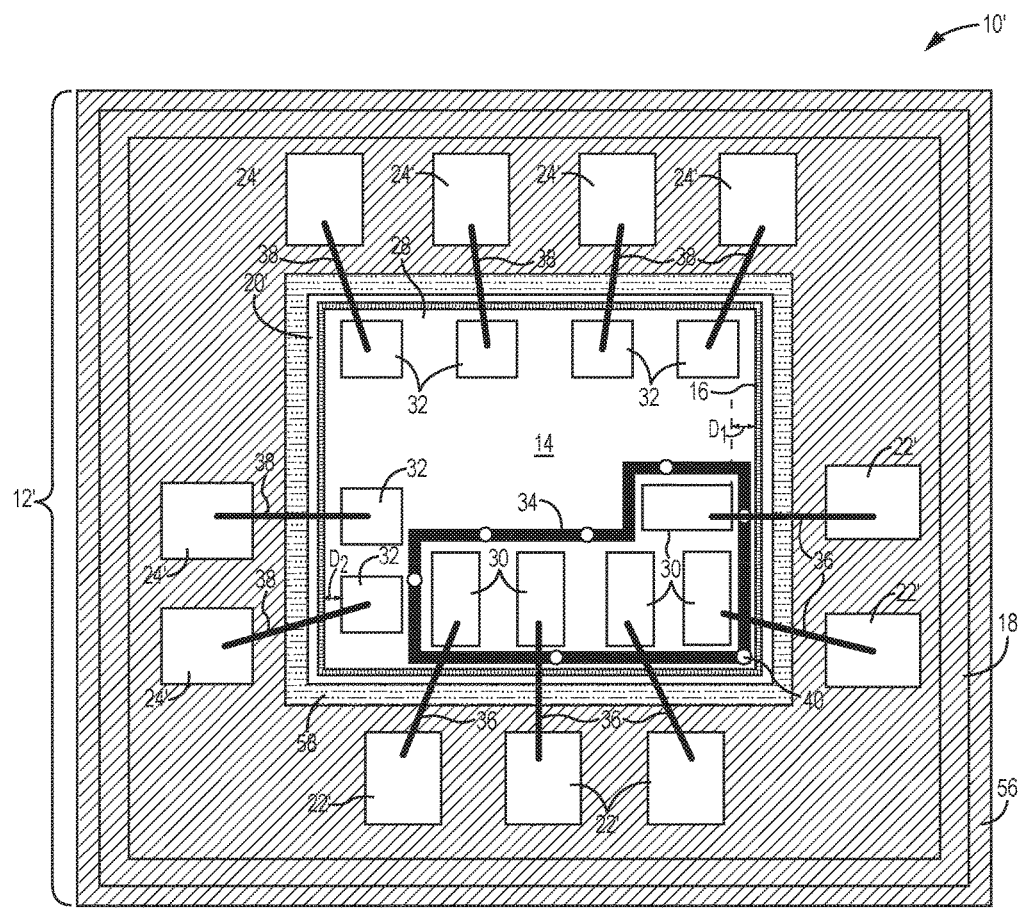

FIG. 9 provides an exemplary semiconductor package with an alternative grounded fence according to one embodiment of the present disclosure.

Figure 10:
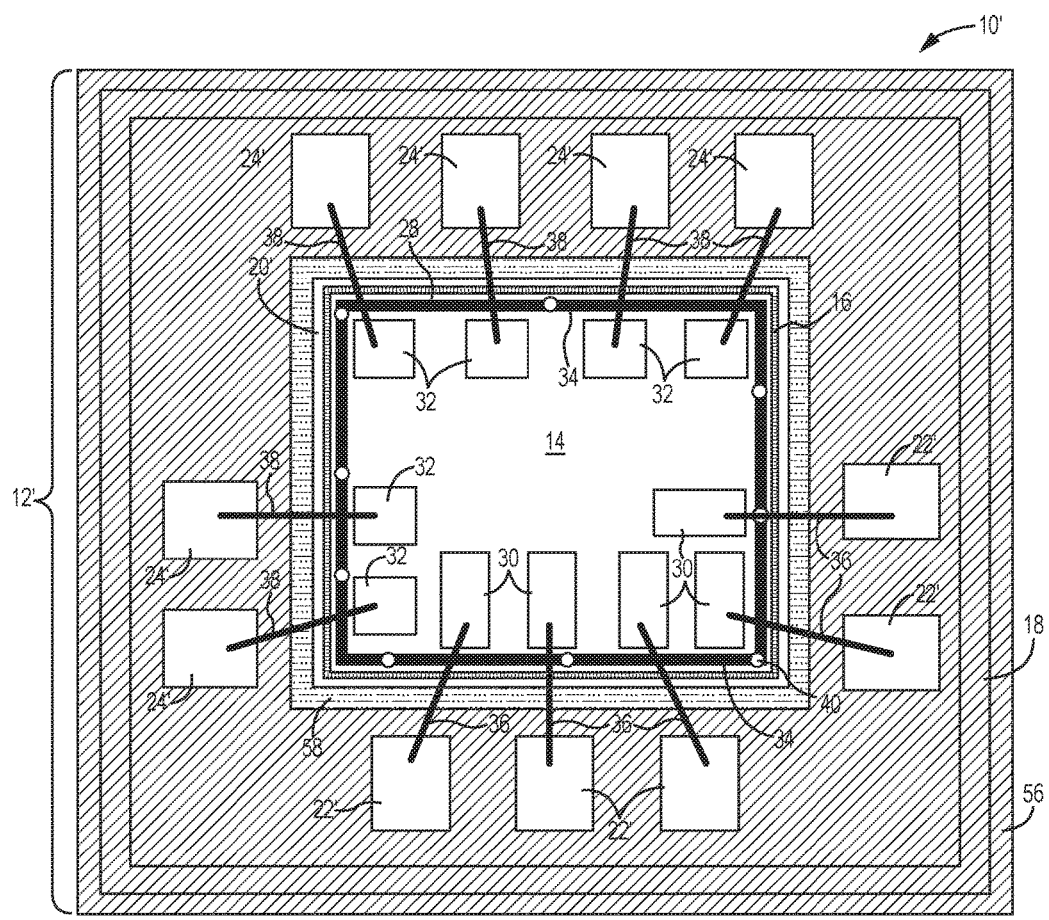

FIG. 10 provides an exemplary semiconductor package with an alternative grounded fence according to one embodiment of the present disclosure.

Figure 11:
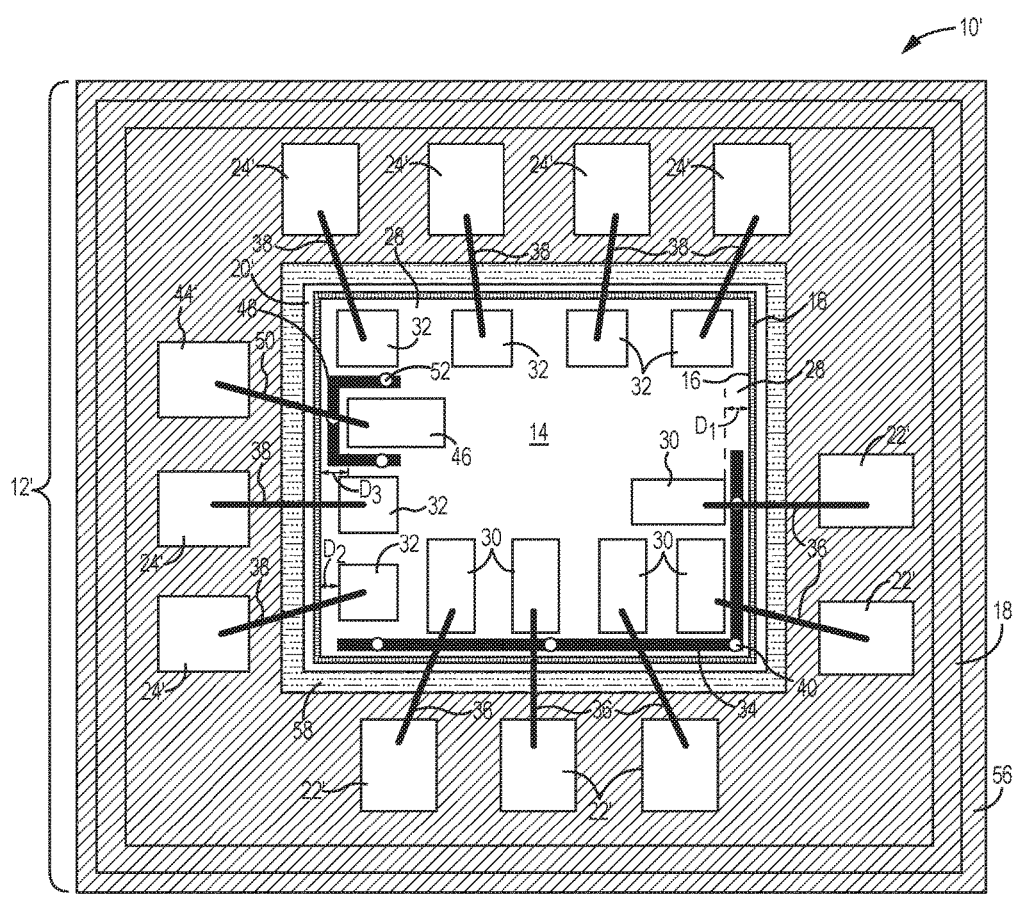

FIG. 11 provides an exemplary semiconductor package with an alternative grounded fence according to one embodiment of the present disclosure.

Figure 12:
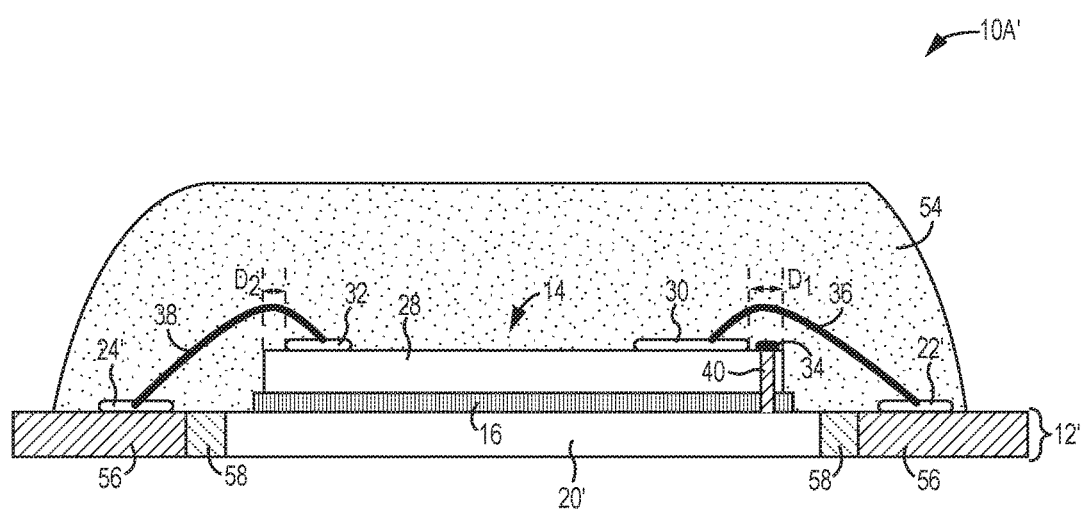

FIG. 12 provides an exemplary semiconductor package with multiple grounded fences according to one embodiment of the present disclosure.

It will be understood that for clear illustrations, FIGS. 1A-12 may not be drawn to scale.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

FIG. 1A shows a top view of an exemplary semiconductor package 10 according to one embodiment of the present disclosure. FIG. 1B is a cross-sectional view of the semiconductor package 10 at the dashed-line in FIG. 1A. The semiconductor package 10 includes a carrier 12, a wire-bonded die 14, a die-attach material 16, and an enclosure 18. In different applications, the semiconductor package 10 may include more than one wire-bonded die 14.

For the purpose of this illustration, the carrier 12 includes a die pad 20, five first negative carrier contacts 22, six non-negative carrier contacts 24, and a carrier adhesive 26. In different applications, the carrier 12 may include fewer or more first negative carrier contacts 22/non-negative carrier contacts 24. Herein, negative carrier contacts refer to contacts of the carrier 12 that are intended to receive negative voltages and non-negative carrier contacts refer to contacts of the carrier 12 that are intended to receive positive or zero (ground) voltages.

In this embodiment, the carrier 12 may be a lead frame such that the first negative carrier contacts 22 and the non-negative carrier contacts 24 are metal leads and the die pad 20 is a metal pad. The die pad 20 is surrounded by the first negative carrier contacts 22 and the non-negative carrier contacts 24. The carrier adhesive 26 is filled between the die pad 20 and the first negative carrier contacts 22/non-negative carrier contacts 24, and configured to fix the die pad 20, the first negative carrier contacts 22, and the non-negative carrier contacts 24 together. The carrier adhesive 26 may not extend beyond the first negative carrier contacts 22 or the non-negative carrier contacts 24, such that a portion of each first negative carrier contact 22 and a portion of each non-negative carrier contact 24 are exposed. The die pad 20, the first negative carrier contacts 22, and the non-negative carrier contacts 24 may be formed of pure metal, such as copper, nickel, gold, tin, lead, or silver, or alloy metals.

The wire-bonded die 14 includes a die body 28 having a top surface and a bottom surface opposite the top surface of the die body 28, five first negative die contacts 30, six non-negative die contacts 32, a first grounded fence 34, five first bonding wires 36, and six second bonding wires 38. Herein, negative die contacts refers to contacts of the wire-bonded die 14 that are intended to receive negative voltages and non-negative die contacts refer to contacts of the wire-bonded die 14 that are intended to receive positive or zero (ground) voltages. In different applications, the wire-bonded die 14 may include fewer or more first negative die contacts 30/non-negative die contacts 32/first bonding wires 36/second bonding wires 38. For some specific cases (for instance, the wire-bonded die 14 is a switch die), the wire-bonded die 14 may only need negative voltage supply. As such, there may be no non-negative die contacts 32 included in the wire-bonded die 14. Consequently, the carrier 12 may not include any non-negative carrier contact 24.

Herein, the first negative die contacts 30, the non-negative die contacts 32, and the first grounded fence 34 reside on the top surface of the die body 28. In one embodiment, the first negative die contacts 30 may be adjacent to each other and reside close to the periphery of the top surface of the die body 28. Each first negative die contact 30 is apart from the periphery of the top surface of the die body 28 with a first distance D1 (the first distance D1 for each first negative die contact 30 may be different). The first grounded fence 34 is continuous and extends between each first negative die contact 30 and the periphery of the top surface of the die body 28. In one embodiment, the first grounded fence 34 is the only component between each first negative die contact 30 and the periphery of the top surface of the die body 28.

Each non-negative die contact 32 is apart from the periphery of the top surface of the die body 28 with a second distance D2 (the second distance D2 for each non-negative die contact 32 may be different). Since the first grounded fence 34 may not extend between the non-negative die contacts 32 and the periphery of the top surface of the die body 28, the second distance D2 may be shorter than the first distance D1. The first distance D1 needs at least a sum of the minimum metal-to-die edge spacing, a width of the first grounded fence 34, and the minimum metal-to-metal spacing, while the second distance D2 needs at least the minimum metal-to-die edge spacing. The first grounded fence 34 may be formed from metal strips.

The bottom surface of the die body 28 is coupled with a top surface of the die pad 20 by the die-attach material 16. The die-attach material 16 may be a dendrite forming metal, such as sintered silver or tin. The first grounded fence 34 has a same DC potential as the die pad 20. In one embodiment, the first grounded fence 34 may be electronically coupled to the die pad 20 by first via structures 40 through the die body 28 and the die-attach material 16 (only one first via structure is labeled with a reference number for clarity). Herein, the die pad 20 is biased at zero voltage (ground), thus the first grounded fence 34 is electronically coupled to ground. Each first bonding wire 36 extends from one first negative die contact 30 to a corresponding first negative carrier contact 22 and is not in contact with the first grounded fence 34. Once negative voltages are applied to the first negative carrier contacts 22, the first negative die contacts 30 will have negative voltage biases. In addition, each second bonding wire 38 extends from one non-negative die contact 32 to a corresponding non-negative carrier contact 24 and is not in contact with the first grounded fence 34. Once non-negative voltages are applied to the non-negative carrier contacts 24, the non-negative die contacts 32 will have non-negative voltage biases.

The wire-bonded die 14 may be formed by Gallium nitride (GaN) technology, Gallium arsenide (GaAs) technology, Indium phosphide (InP) technology, Silicon (Si) technology, Silicon carbide (SiC) technology, or diamond technology, and may include at least one of a bipolar transistor, a hetero-bipolar transistor (HBT), a field-effect transistor (FET), and a high-electron-mobility transistor (HEMT). As such, at least one first negative die contact 30 may be a terminal, which requires negative bias, of the bipolar transistor, the HBT, the FET, or the HEMT included in the wire-bonded die 14.

Notice that, since the first grounded fence 34 has a same DC potential, may be ground, as the die pad 20, a potential electric field around the first negative die contacts 30 will be confined between the first negative die contacts 30 and the first grounded fence 34. The first grounded fence 34 contains the potential electric field from reaching the periphery of the top surface of the die body 28, extending along the side walls of the die body and towards the die-attach material 16. Consequently, there is no dendrite of the die-attach material 16 growing along the side walls of the die body 28 towards the first negative die contacts 30 because of the absence of an electric field around the die-attach material 16.

In addition, when the carrier 12 is a lead frame, the enclosure 18 is coupled to the first negative carrier contacts 22, the non-negative carrier contacts 24, and the carrier adhesive 26 to form a cavity 42. As such, the wire-bonded die 14 is disposed within the cavity 42. The first negative die contacts 30, the non-negative die contacts 32, the first bonding wires 36, and the second bonding wires 38, are exposed to a gaseous environment within the cavity 42.

It will be clear to those skilled in the art that the first grounded fence 34 may have different configurations. As shown in FIG. 2, the first grounded fence 34 extends between each first negative die contact 30 and the periphery of the top surface of the die body 28 and may further extend between the first negative die contacts 30 and the adjacent non-negative die contacts 32, such that the first negative die contacts 30 are at least partially encompassed by the first grounded fence 34. Further, the first grounded fence 34 may fully encompass the first negative die contacts 30 as illustrated in FIG. 3. Herein, the first grounded fence 34 may be a closed-loop and may be in the shape of a circle, rectangle, oblong, or polygon.

In one embodiment, the first grounded fence 34 may extend between each first negative die contact 30 and the periphery of the top surface of the die body 28, and between each non-negative die contact 32 and the periphery of the top surface of the die body 28, as illustrated in FIG. 4. The first grounded fence 34 may be a closed-loop that is adjacent to the periphery of the top surface of the die body 28. The first grounded fence 34 may encompass the first negative die contacts 30 and the non-negative die contacts 32.

In another embodiment, the carrier 12 may further include a second negative carrier contact 44 and the wire-bonded die 14 may further include a second negative die contact 46, a second grounded fence 48, and a third bonding wire 50 as illustrated in FIG. 5. For different applications, the carrier 12 may include more second negative carrier contacts 44 and the wire-bonded die 14 may include more second negative die contacts 46/third bonding wires 50. The first negative carrier contacts 22, the second negative carrier contact 44, and the non-negative carrier contacts 24 surround the die pad 20. The carrier adhesive 26 is configured to fix the die pad 20, the first negative carrier contacts 22, the second negative carrier contact 44, and the non-negative carrier contacts 24 together.

The second negative die contact 46 resides on the top surface of the die body 28 and is not adjacent to any of the first negative die contacts 30. The second negative die contact 46 is apart from the periphery of the top surface of the die body 28 with a third distance D3. The second grounded fence 48 resides on the top surface of the die body 28, and extends between the second negative die contact 46 and the periphery of the top surface of the die body 28. Since the second grounded fence 48 may not extend between the non-negative die contacts 32 and the periphery of the top surface of the die body 28, the second distance D2 may be shorter than the third distance D3. The third distance D3 needs at least a sum of the minimum metal-to-die edge spacing, a width of the second grounded fence 48, and the minimum metal-to-metal spacing. In some applications, the second grounded fence 48 may further extend between the second negative die contact 46 and the adjacent non-negative die contacts 32. The second grounded fence 48 may be formed from metal strips. Herein, the second grounded fence 48 may be separate from the first grounded fence 34 and have no overlap with the first grounded fence 34.

The second grounded fence 48 has a same DC potential as the die pad 20. In one embodiment, the second grounded fence 48 may be electronically coupled to the die pad 20 by second via structures 52 through the die body 28 and the die-attach material 16 (only one second via structure is labeled with a reference number for clarity). The third bonding wire 50 extends from the second negative die contact 46 to the second negative carrier contact 44 and is not in contact with the second grounded fence 48. Once a negative voltage is applied to the second negative carrier contact 44, the second negative die contact 46 will have a negative voltage bias.

For some applications, especially for low frequency applications, an alternative semiconductor package 10A may include a mold compound 54 instead of the enclosure 18 to encapsulate the wire-bonded die 14, as illustrated in FIG. 6. Herein, the mold compound 54 resides over the carrier 12, such that the exposed surfaces of the wire-bonded die 14, the first bonding wires 36, and the second bonding wires 38 are covered by the mold compound 54. The mold compound 54 may be formed of porous materials.

FIG. 7A provides a top view of another semiconductor package 10' according to one embodiment of the present disclosure. FIG. 7B is a cross-sectional view of the semiconductor package 10' at the dashed-line in FIG. 7A. The semiconductor package 10' includes an alternative carrier 12', the wire-bonded die 14, the die-attach material 16, and the enclosure 18.

In this embodiment, the carrier 12' may be a laminate substrate, which includes a die pad 20', five first negative carrier contacts 22', six non-negative carrier contacts 24', a carrier body 56, and a carrier-attach material 58. In different applications, the carrier 12' may include fewer or more first negative carrier contacts 22'/non-negative carrier contacts 24'. The die pad 20' is embedded in the carrier body 56 via the carrier-attach material 58 and extends from a top surface of the carrier body 56 to a bottom surface of the carrier body 56. The first negative carrier contacts 22' and the non-negative carrier contacts 24' reside on the top surface of the carrier body 56 and surround the die pad 20'. To simplify the illustration of the semiconductor package 10', the present disclosure does not show how to couple the first negative carrier contacts 22'/the non-negative carrier contacts 24' to layers (not shown) in the carrier body 56.

Herein, the bottom surface of the die body 28 is coupled with a top surface of the die pad 20' by the die-attach material 16. The first grounded fence 34 has a same DC potential as the die pad 20'. In one embodiment, the first grounded fence 34 may be electronically coupled to the die pad 20' by the first via structures 40 through the die body 28 and the die-attach material 16. Since the die pad 20' is biased at zero voltage (ground), the first grounded fence 34 is electronically coupled to ground. Each first bonding wire 36 extends from one first negative die contact 30 to a corresponding first negative carrier contact 22' and is not in contact with the first grounded fence 34. Once negative voltages are applied to the first negative carrier contacts 22' through the multi-layers in the carrier body 56 (not shown), the first negative die contacts 30 will have negative voltage biases. Each second bonding wire 38 extends from one non-negative die contact 32 to a corresponding non-negative carrier contact 24' and is not in contact with the first grounded fence 34. Once non-negative voltages are applied to the non-negative carrier contacts 24' through the multi-layers in the carrier body 56 (not shown), the non-negative die contacts 32 will have non-negative voltage biases. When the carrier 12' is a laminate substrate, the enclosure 18 is coupled to the carrier body 56 to form the cavity 42. As such, the wire-bonded die 14 is disposed within the cavity 42. The first negative carrier contact 22', the non-negative carrier contacts 24', the first negative die contacts 30, the non-negative die contacts 32, the first bonding wires 36, and the second bonding wires 38 are exposed to a gaseous environment within the cavity 42.

In this embodiment, the first grounded fence 34 of the semiconductor package 10' is continuous and extends between each first negative die contact 30 and the periphery of the top surface of the die body 28. The first grounded fence 34 may not extend between any non-negative die contact 32 and the periphery of the top surface of the die body 28.

As shown in FIGS. 8-10, the first grounded fence 34 of the semiconductor package 10' may have different configurations. In FIG. 8, the first grounded fence 34 extends between each first negative die contact 30 and the periphery of the top surface of the die body 28 and may further extend between the first negative die contacts 30 and the adjacent non-negative die contacts 32, such that the first negative die contacts 30 are at least partially encompassed by the first grounded fence 34. In FIG. 9, the first grounded fence 34 may fully encompass the first negative die contacts 30. Herein, the first grounded fence 34 may be a closed-loop and may be in the shape of a circle, rectangle, oblong, or polygon. In FIG. 10, the first grounded fence 34 extends between each first negative die contact 30 and the periphery of the top surface of the die body 28, and between each non-negative die contact 32 and the periphery of the top surface of the die body 28. The first grounded fence 34 may be a closed-loop that is adjacent to the periphery of the top surface of the die body 28. The first grounded fence 34 may encompass the first negative die contacts 30 and the non-negative die contacts 32.

FIG. 11 shows the semiconductor package 10' having multiple grounded fences. The carrier 12' may include a second negative carrier contact 44'. For different applications, the carrier 12' may include more second negative carrier contacts 44'. The first negative carrier contacts 22', the second negative carrier contact 44', and the non-negative carrier contacts 24' reside on the top surface of the carrier body 56 and surround the die pad 20'. The second grounded fence 48 of the wire-bonded die 14 has a same DC potential as the die pad 20'. In one embodiment, the second grounded fence 48 is electronically coupled to the die pad 20' by the second via structures 52 through the die body 28 and the die-attach material 16 (only one second via structure is labeled with a reference number for clarity). The third bonding wire 50 extends from the second negative die contact 46 to the second negative carrier contact 44' and is not in contact with the second grounded fence 48. Once a negative voltage is applied to the second negative carrier contact 44' through the multi-layers in the carrier body 56 (not shown), the second negative die contact 46 will have a negative voltage bias.

For some applications, unlike the semiconductor package 10' including the enclosure 18 to encapsulate the wire-bonded die 14, an alternative semiconductor package 10A' may include the mold compound 54 to encapsulate the wire-bonded die 14, as illustrated in FIG. 12. Herein, the mold compound 54 resides over the carrier 12', such that the exposed surfaces of the wire-bonded die 14, the first negative carrier contact 22', the non-negative carrier contacts 24', the first negative die contacts 30, the non-negative die contacts 32, the first bonding wires 36, and the second bonding wires 38 are covered by the mold compound 54.

Those skilled in the art will recognize improvements and modifications to the preferred embodiments of the present disclosure. All such improvements and modifications are considered within the scope of the concepts disclosed herein and the claims that follow.

What is claimed is:

1. An apparatus comprising:
a carrier comprising a die pad, a non-negative carrier contact to receive non-negative voltages, and a first negative carrier contact to receive negative voltages, wherein the die pad is surrounded by the first negative carrier contact and the non-negative carrier contact;
a die-attach material;
a wire-bonded die comprising a die body that has a top surface and a bottom surface opposite the top surface of the die body, a non-negative die contact to receive the non-negative voltages, a first negative die contact to receive the negative voltages, a first grounded fence electronically coupled to ground, a first bonding wire, and a second bonding wire, wherein:
the bottom surface of the die body is coupled with a top surface of the die pad by the die-attach material;
the non-negative die contact, the first negative die contact, and the first grounded fence reside over the top surface of the die body;
the first grounded fence, which has a same DC potential as the die pad, extends between the first negative die contact and a periphery of the top surface of the die body, and does not extend between the non-negative die contact and the periphery of the top surface of the die body;
the first bonding wire extends from the first negative die contact to the first negative carrier contact, and the second bonding wire extends from the non-negative die contact to the non-negative carrier contact.

2. The apparatus of claim 1 wherein the die-attach material is a dendrite forming metal.

3. The apparatus of claim 2 wherein the die-attach material is formed of sintered silver or tin.

4. The apparatus of claim 1 wherein a first distance between the first negative die contact and the periphery of the top surface of the die body is longer than a second distance between the non-negative die contact and the periphery of the top surface of the die body.

5. The apparatus of claim 2 wherein the first grounded fence is electronically coupled to the die pad by a via structure through the die body and the die-attach material.

6. The apparatus of claim 2 wherein the wire-bonded die is formed by one of a group consisting of Gallium nitride (GaN) technology, Gallium arsenide (GaAs) technology, Indium phosphide (InP) technology, Silicon (Si) technology, Silicon carbide (SiC) technology, and diamond technology.

7. The apparatus of claim 2 wherein the first grounded fence is formed from metal strips.

8. The apparatus of claim 2 wherein the wire-bonded die further comprises a second negative die contact that receives the negative voltages, resides over the top surface of the die body, and is adjacent to the first negative die contact, wherein the first grounded fence is continuous and extends between the second negative die contact and the periphery of the top surface of the die body.

9. The apparatus of claim 2 wherein the carrier is a lead frame such that the non-negative carrier contact and the first negative carrier contact are metal leads and the die pad is a metal pad.

10. The apparatus of claim 9 further comprising an enclosure that is coupled to the non-negative carrier contact and the first negative carrier contact, and forms a cavity over the carrier, wherein:
the wire-bonded die is disposed within the cavity; and
the first bonding wire and the second bonding wire are exposed to a gaseous environment within the cavity.

11. An apparatus comprising:
a carrier comprising a die pad, a first negative carrier contact, and a second negative carrier contact, wherein the first negative carrier contact and the second negative carrier contact receive negative voltages;
a die-attach material;
a wire-bonded die comprising a die body that has a top surface and a bottom surface opposite the top surface of the die body, a non-negative die contact to receive non-negative voltages, a first negative die contact and a second negative die contact to receive the negative voltages, a first grounded fence electronically coupled to ground, a first bonding wire, and a second bonding wire, wherein:
the first negative die contact and the second negative die contact receive the negative voltages;
the bottom surface of the die body is coupled with a top surface of the die pad by the die-attach material;
the first negative die contact, the second negative die contact, and the first grounded fence reside over the top surface of the die body;
the first negative die contact is adjacent to the second negative die contact; the first grounded fence, which has a same DC potential as the die pad, is continuous, and extends between the first negative die contact and a periphery of the top surface of the die body, and between the second negative die contact and the periphery of the top surface of the die body;
the first bonding wire extends from the first negative die contact to the first negative carrier contact, and
the second bonding wire extends from the second negative die contact to the second negative carrier contact.

12. The apparatus of claim 11 wherein the die-attach material is a dendrite forming metal.

13. The apparatus of claim 12 wherein the die-attach material is formed of sintered silver or tin.

14. The apparatus of claim 12 wherein the first grounded fence is electronically coupled to the die pad by a via structure through the die body and the die-attach material.

15. The apparatus of claim 12 wherein the wire-bonded die is formed by one of a group consisting of Gallium nitride (GaN) technology, Gallium arsenide (GaAs) technology, Indium phosphide (InP) technology, Silicon (Si) technology, Silicon carbide (SiC) technology, and diamond technology.

16. The apparatus of claim 12 wherein the first grounded fence is formed from metal strips.

17. The apparatus of claim 12 wherein the carrier is a lead frame such that the first negative carrier contact and the second negative carrier contact are metal leads and the die pad is a metal pad.

18. The apparatus of claim 14 further comprising an enclosure that is coupled to the first negative carrier contact and the second negative carrier contact, and forms a cavity over the carrier, wherein:
the wire-bonded die is disposed within the cavity; and
the first bonding wire and the second bonding wire are exposed to a gaseous environment within the cavity.

19. The apparatus of claim 1 wherein the first grounded fence further extends between the first negative die contact and the non-negative die contact, such that the first negative die contact is at least partially encompassed by the first grounded fence.

20. The apparatus of claim 19 wherein the first grounded fence is a closed-loop and fully encompasses the first negative die contact.

21. The apparatus of claim 1 wherein the wire-bonded die further comprises a second negative die contact to receive the negative voltages and a second grounded fence electronically coupled to ground, wherein:
the second negative die contact resides over the top surface of the die body and is not adjacent to the first negative die contact;
the second grounded fence, which has a same DC potential as the die pad, resides over the top surface of the die body and extends between the second negative die contact and the periphery of the top surface of the die body; and
the second grounded fence is separate from the first grounded fence.

22. The apparatus of claim 21 wherein the second grounded fence does not extend between the non-negative die contact and the periphery of the top surface of the die body.

23. The apparatus of claim 2 wherein the carrier is a laminate substrate and further comprises a carrier body, wherein:
the die pad is embedded in the carrier body and extends from a top surface of the carrier body to a bottom surface of the carrier body; and
the first negative carrier contact and the non-negative carrier contact reside over the top surface of the carrier body.

24. The apparatus of claim 23 further comprising an enclosure that is coupled to the carrier body to form a cavity over the carrier, wherein:
the wire-bonded die is disposed within the cavity; and
the first negative carrier contact, the non-negative carrier contact, the first bonding wire, and the second bonding wire are exposed to a gaseous environment within the cavity.

25. The apparatus of claim 2 further comprising a mold compound that resides over the carrier to encapsulate the wire-bonded die.

* * * * *